(12) United States Patent
Mitsui

(10) Patent No.: US 6,333,880 B1
(45) Date of Patent: Dec. 25, 2001

(54) SEMICONDUCTOR MEMORY DEVICE CAPABLE OF DETECTING HIGH-VOLTAGE TEST COMMAND SIGNAL

(75) Inventor: Katsuyoshi Mitsui, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/783,104

(22) Filed: Feb. 15, 2001

(30) Foreign Application Priority Data

Jul. 14, 2000 (JP) .................................................. 12-214652

(51) Int. Cl.[7] ...................................................... G11C 7/00
(52) U.S. Cl. ................ 365/201; 365/189.07; 365/189.09
(58) Field of Search .............................. 365/201, 189.07, 365/189.09, 189.03, 243, 175

(56) References Cited

U.S. PATENT DOCUMENTS 5,963,490 * 10/1999 Kawamura ............................ 365/201

OTHER PUBLICATIONS

"A New On–Chip Voltage Converter for Submicrometer High–Density DRAM's", T. Furuyama, et al., IEEE Journal of Solid–State Circuits, vol. SC–22, No. 3, Jun. 1987, pp. 437–440.

* cited by examiner

Primary Examiner—Viet Q. Nguyen
Assistant Examiner—David Lam
(74) Attorney, Agent, or Firm—McDermott, Will & Emery

(57) ABSTRACT

A semiconductor memory device includes a voltage detection circuit. The voltage detection circuit uses a voltage division circuit to derive from a test command voltage forming a test command signal EXTSH a voltage fraction which is one-third of the original voltage and uses another voltage division circuit to derive from an external supply voltage a voltage fraction which is a half of the original voltage. The two voltage fractions are compared by a comparison circuit of differential amplification type to detect the test command voltage and cause transition of a test target circuit of the semiconductor memory device to a test mode. P channel MOS transistors constituting the voltage division circuits all operate in resistance mode. The test command signal of high-voltage can thus be detected.

6 Claims, 8 Drawing Sheets

SEMICONDUCTOR MEMORY DEVICE CAPABLE OF DETECTING HIGH-VOLTAGE TEST COMMAND SIGNAL

BACKGROUND OF THE INVENTION

1. Field of the Invention

The present invention relates to semiconductor memory devices, and particularly to a semiconductor memory device having a voltage detection circuit capable of detecting a high-voltage test command signal supplied when a test is conducted.

2. Description of the Background Art

A test for a semiconductor memory device having no exclusive test terminal, especially a test after packaging, is carried out by applying a test command voltage higher than the range of an input voltage applied to a specified input/output terminal in a normal operation so as to cause transition of the semiconductor memory device to a desired test state. In this case, the test command voltage applied is higher than the input voltage range for the normal operation in order to prevent an erroneous transition to the test mode of the semiconductor memory device in the normal operation.

As shown in FIG. 5, a conventional semiconductor memory device 200 includes a test circuit 210 and a test target circuit 250. Test circuit 210 includes a delay circuit 220, a voltage detection circuit 230, and a test mode transition circuit 240. Test target circuit 250 includes an input/output interface circuit 260.

Delay circuit 220 generates signals SVDEND and SVDENF according to an activation signal SVDEN and outputs the resultant signals to voltage detection circuit 230. Voltage detection circuit 230 is activated according to signals SVDEND and SVDENF from delay circuit 220 to detect a test command signal EXTSH supplied from an input/output terminal in a manner described later, and output a result of the detection to test mode transition circuit 240.

Test mode transition circuit 240 provides, when a signal DET indicating detection of test command signal EXTSH is supplied from voltage detection circuit 230, a test mode transition signal TME to test target circuit 250 via input/output interface circuit 260 to cause transition of test target circuit 250 to a test mode.

Referring to FIG. 6, conventional voltage detection circuit 230 includes N channel MOS transistors 301–304, 310–315 and 317, and P channel MOS transistors 307–309 and 316. N channel MOS transistors 301–304 are connected in series between an input node N10 and a ground node 305. N channel MOS transistors 301–304 constitute a voltage division circuit 320 that is activated according to turn-on of N channel MOS transistor 304. N channel MOS transistors 301–304 derive from a voltage of test command signal EXISH a fraction thereof and output the voltage fraction to a node N11.

P channel MOS transistors 308 and 309 and N channel MOS transistors 310–312 constitute a comparison circuit 330 of the differential amplification type, amplifying a result of comparison between a voltage on a node N12 and a voltage on node N11 to output the amplified result to a node N13. Comparison circuit 330 is disposed between ground node 305 and a power supply node 306 applied with an external supply voltage.

N channel MOS transistors 313–315 are connected in series between ground node 305 and power supply node 306 to constitute a voltage division circuit 340 that is activated by turn-on of N channel MOS transistor 315. Voltage division circuit 340 derives from the external supply voltage applied to supply node 306 a fraction thereof and outputs the voltage fraction to node N12.

P channel MOS transistor 316 and N channel MOS transistor 317 constitute an inverter 350, converting an analog signal on node N13 that is the output of comparison circuit 330 into a logic signal according to its magnitude.

P channel MOS transistor 307 and N channel MOS transistor 312 are turned on/off according to signal SVDEND to activate or inactivate comparison circuit 330. N channel MOS transistors 304 and 315 are turned on/off according to signal SVDENF to activate or inactivate voltage division circuits 320 and 340 respectively.

Voltage detection circuit 230 has its input node N10 receiving test command signal EXTSH when transition of semiconductor memory device 200 to a test mode is to be caused. Test command signal EXTSH is formed of a voltage higher than an input voltage range in a normal operation.

Voltage division circuit 320 uses N channel MOS transistors 301–303 to derive from the voltage forming the test command signal a fraction thereof and output the voltage fraction to node N11. Voltage division circuit 340 uses N channel MOS transistors 313 and 314 to derive from the external supply voltage a fraction thereof and output the voltage fraction to node N12. The voltage resulting from the division on node N12 is then compared with the voltage resulting from the division on node N11 by N channel MOS transistors 310 and 311. A result of the comparison is amplified by P channel MOS transistors 308 and 309 to be supplied to node N13.

If the voltage on node N11 is higher than the voltage on node N12, comparison circuit 330 provides a voltage V1, which is lower than a voltage on a node N14 connecting P channel MOS transistor 309 and N channel MOS transistor 311, to node N13. If the voltage on node N11 is lower than the voltage on node N12, comparison circuit 330 provides a voltage V2 higher than the voltage on node N14.

Accordingly, if a voltage to cause switch between on and off of P channel MOS transistor 316 and N channel MOS transistor 317 is set between voltage V1 and voltage V2, inverter 350 outputs a logic signal SVIHDET of an H (logical high) level when voltage V1 on node N13 is applied and outputs logic signal SVIHDET of an L (logical low) level when voltage V2 on node N13 is applied. In other words, if a voltage resulting from division of a voltage forming test command signal EXTSH is higher than a voltage resulting from division of an external supply voltage, inverter 350 outputs logic signal SVIHDET of H level. If the voltage resulting from division of the voltage forming test command signal EXTSH is lower than the voltage resulting from division of the external supply voltage, inverter 350 outputs logic signal SVIHDET of L level.

Then, the output of logic signal SVIHDET of H level from voltage detection circuit 230 means that test command signal EXTSH is detected, while the output of logic signal SVIHDET of L level from voltage detection circuit 230 means that test command signal EXTSH is not detected. Logic signal SVIHDET of H level constitutes signal DET indicating detection of test command signal EXTSH.

Test mode transition circuit 240 provides test mode signal TME to test target circuit 250 when test mode transition circuit 240 receives logic signal SVIHDET (signal DET) of H level from voltage detection circuit 230. Receiving test mode signal TME via input/output interface circuit 260, test target circuit 250 makes transition to a test mode.

When voltage detection circuit 230 is inactive, N channel MOS transistors 304 and 315 are turned off. A potential on node N12 is thus set at the external supply voltage applied from power supply node 306. On the other hand, a potential on node N11, which is not fixed at the external supply voltage nor a ground potential, is equal to a potential on node N10 receiving test command signal EXTSH. In this state, suppose that signal SVDENF of H level is applied to turn on N channel MOS transistors 304 and 315, causing transition of voltage division circuits 320 and 340 from an inactive state to an active state, and a voltage lower than the high voltage of the test command signal and higher than the external supply voltage is applied to node N10. In this case, the potential on node N12 is higher than the potential on node N11 and any malfunction could occur in the period in which the potentials on nodes N11 and N12 are corrected to proper voltages that are obtained by voltage division.

In order to solve this problem, as shown in FIG. 7, delay circuit 220 having a delay unit 221, inverters 222, 223 and 225 and an NOR gate 224 is provided. Signals SVDEND and SVDENF following the timing chart shown in FIG. 8 are generated from activation signal SVDEN, signal SVDEND is supplied to P channel MOS transistors 307 and N channel MOS transistor 312 that activate comparison circuit 330, and signal SVDENF is supplied to N channel MOS transistors 304 and 315 that activate voltage division circuits 320 and 340. Specifically, as shown in FIG. 8, signal SVDEND is delayed with respect to signal SVDENF by a predetermined time T, voltage division circuits 320 and 340 are activated, and comparison circuit 330 is thereafter activated after respective potentials on node N11 and node N12 return to correct voltages respectively that result from voltage division. In this way, the problem above of malfunction can be solved.

The method described above is used to detect test command signal EXTSH by voltage detection circuit 230, cause transition of test target circuit 250 to a test mode, thereafter input a specified pattern from input/output terminals for address signals via input/output interface circuit 260 and accordingly conduct a test for test target circuit 250.

However, there is a problem that test command signal EXTSH cannot be detected in a stable manner. This is because voltage division circuits 320 and 340 of voltage detection circuit 230 are constructed of N channel MOS transistors operating under different conditions, and variation in manufacturing conditions for the N channel MOS transistors could change a detectable voltage value.

Specifically, N channel MOS transistors 301 and 302 that constitute voltage division circuit 320 together with N channel MOS transistor 303 operate in resistance mode (meaning diode connection, which is applied hereinafter), and N channel MOS transistor 303 operates in threshold mode. N channel MOS transistor 313, which is one of N channel MOS transistors 313 and 314 constituting voltage division circuit 340, operates in resistance mode while the other N channel MOS transistor 314 operates in threshold mode. Accordingly, a voltage resulting from division by voltage division circuits 320 and 340 each is not equal to the voltage determined by dividing an original voltage by the number of N channel MOS transistors. In order to keep a detected voltage at a constant value, both of the threshold and channel resistance of the N channel MOS transistors constituting voltage division circuits 320 and 340 should be controlled. Then, change of manufacturing conditions for the N channel MOS transistors would readily cause changes in threshold voltage and channel resistance, making it impossible to maintain a detected voltage at a constant value.

Another problem is increase in size of test circuit 210, since a large area is occupied by delay circuit 220 which is arranged on semiconductor memory device 200 for preventing a malfunction in transition from the inactive state to the active state as discussed above.

SUMMARY OF THE INVENTION

One object of the present invention is accordingly to provide a semiconductor memory device including a voltage detection circuit in a test circuit that can detect a high-voltage of a certain value.

Another object of the invention is to provide a semiconductor memory device including a voltage detection circuit in a test circuit where no malfunction occurs in transition from an inactive state to an active state without increasing the area occupied by the test circuit.

A semiconductor memory device according to the invention includes an input/output terminal for inputting thereto a test command voltage forming a test command signal, a test target circuit, and a test circuit. The test circuit uses n diode-connected MOS transistors connected in series (n is a natural number of at least three) to derive from the test command voltage a first voltage fraction which is one-nth as high as the test command voltage. The test circuit uses m diode-connected MOS transistors connected in series (m is a natural number smaller than n) to derive from an external supply voltage a second voltage fraction which is one-mth as high as the external supply voltage. The test circuit causes transition of the test target circuit to a test mode when the first voltage fraction is equal to or higher than the second voltage fraction.

The semiconductor memory device according to the invention uses the serially connected n MOS transistors to derive from the test command voltage applied via the input/output terminal the voltage fraction which is one-nth as high as the original test command voltage and uses the serially connected m MOS transistors to derive from the external supply voltage the voltage fraction which is one-mth as high as the original external supply voltage. When a test command voltage which is at least n/m times as high as an external supply voltage is applied, the test command voltage is detected according to the first voltage fraction equal to or higher than the second voltage fraction, and accordingly the test circuit causes transition of the test target circuit to a test mode. According to the invention, a test command signal can be detected in a stable manner by supplying as the test command signal a test command voltage which is at least n/m times as high as an external supply voltage. Transition of the test target circuit to the test mode can thus be ensured.

According to the present invention, the n MOS transistors operating in a first resistance mode are used to derive from the test command voltage the voltage fraction which is one-nth as high as the original voltage, and the m MOS transistors operating in a second resistance mode are used to derive from the external supply voltage the voltage fraction which is one-mth as high as the original voltage. Even if the n MOS transistors and the m MOS transistors operate in different resistance modes, the test command signal having its voltage which is at least n/m times as high as the external supply voltage can be detected in a stable manner.

Preferably, the test circuit of the semiconductor memory device includes a voltage detection circuit generating the first and second voltage fractions, and outputting a first logic signal, which indicates detection of the test command voltage according to the first voltage fraction being equal to or higher than the second voltage fraction, and a second logic signal, which indicates detection of the test command voltage according to the first voltage fraction being lower than the second voltage fraction. The test circuit further includes a test mode transition circuit causing transition of the test target circuit to the test mode according to the first logic signal.

When a test command voltage which is at least n/m times as high as an external supply voltage is applied, the voltage detection circuit outputs to the test mode transition circuit the first logic signal which indicates detection of the test command voltage according to the first voltage fraction which is equal to or higher than the second voltage fraction. Then the test mode transition circuit causes transition of the test target circuit to a test mode according to the first logic signal. When a test command voltage which is lower than a voltage which is n/m times as high as the external supply voltage is input, the voltage detection circuit outputs to the test mode transition circuit the second logic signal which indicates detection of the test command voltage according to the first voltage fraction which is lower than the second voltage fraction. Then, the test mode transition circuit does not cause transition of the test target circuit to a test mode. According to the invention, the test command signal can be detected by means of the logic signals. Even if the test command voltage slightly deviates from the voltage which is at least n/m times as high as the external supply voltage, the test command signal can accurately be detected.

Preferably, the voltage detection circuit employed in the test circuit of the semiconductor memory device includes a first voltage division circuit constructed of the serially connected n MOS transistors operating in a first resistance mode to supply the first voltage fraction to a first node, a second voltage division circuit constructed of the serially connected m MOS transistors operating in a second resistance mode to supply the second voltage fraction to a second node, a comparison circuit comparing the first voltage fraction with the second voltage fraction to amplify a result of the comparison and output the amplified result, and a logic circuit outputting the first logic signal when the output of the comparison circuit deviates to one side from a predetermined reference value and outputting the second logic signal when the output of the comparison circuit deviates to the other side from the predetermined reference value.

From the test command voltage and the external supply voltage respectively, the voltage fractions are derived by the different voltage division circuits respectively, the voltage fractions being one-nth (n is a natural number) as high as the original voltage. The resultant two voltage fractions are compared by the comparison circuit of differential amplification type. If a result of the comparison is equal to or higher than a predetermined reference value, in other words, if the test command voltage is equal to or higher than a voltage n/m times as high as the external supply voltage, the test command signal is detected. If the result of the comparison is lower than the predetermined reference value, the test command signal is not detected. According to the invention, the relation in magnitude between the first voltage fraction and the second voltage fraction can be maintained even if the n MOS transistors constituting the first voltage division circuit and the m MOS transistors constituting the second voltage division circuit operate respectively in different resistance modes. The test command signal having a voltage which is at least n/m times as high as the external supply voltage can thus be detected in a stable manner.

Further, according to the invention, the result of the comparison between the two voltage fractions is supplied as a logic signal. The test command signal can be detected correctly even if the test command voltage varies in a range of voltages being at least n/m times as high as the external supply voltage.

Preferably, the voltage detection circuit employed in the test circuit of the semiconductor memory device further includes a ground potential holding circuit connected between a ground node and the first node to hold the first node at a ground potential when the first voltage division circuit is inactive.

In the voltage detection circuit, the first node supplied with the first voltage fraction being one-nth of the test command voltage is kept at the ground potential when the first voltage division circuit is inactive. When the first voltage division circuit is activated, the potential on the first node rises from the ground potential. According to the invention, in the transition period of the first voltage division circuit from the inactive state to the active state, the potential on the first node never becomes higher than the potential on the second node. Malfunction of the voltage detection circuit can be prevented accordingly.

Preferably, the voltage detection circuit employed in the test circuit of the semiconductor memory device further includes a switching circuit connected between the first voltage division circuit and an input node receiving the test command voltage to separate by a third logic signal the first voltage division circuit from the input node and supply by a fourth logic signal the test command voltage to the first voltage division circuit. The voltage detection circuit further includes a potential switching circuit connected between the ground node and the first node to free by the third logic signal the first node from the ground potential and keep by the fourth logic signal the first node at the ground potential.

When the first voltage division circuit is inactive, the first node is kept at the ground potential and no test command voltage is applied to the first voltage division circuit. When the first voltage division circuit is activated, the test command voltage is applied to the first voltage division circuit and the first node has its potential gradually increased by the voltage fraction which is one-nth of the test command voltage. According to the invention, in the transition of the first voltage division circuit from the inactive state to the active state, the potential on the first node never exceeds the potential on the second node and accordingly malfunction of the voltage detection circuit can be avoided.

Preferably, the voltage detection circuit employed in the test circuit of the semiconductor memory device further includes another potential switching circuit connected between the ground node and a third node by which the switching circuit is connected to the first voltage division circuit to free by the third logic signal the third node from the ground potential and keep by the fourth logic signal the third node at the ground potential.

The third node arranged on the input side of the first voltage division circuit is maintained at the ground potential when the first voltage division circuit is inactive and freed from the ground potential when the first voltage division circuit is activated. Even if the voltage detection circuit is switched between the inactive state and the active state, no charge is accumulated on the third node. Therefore, the semiconductor memory device can be tested successively.

The foregoing and other objects, features, aspects and advantages of the present invention will become more apparent from the following detailed description of the present invention when taken in conjunction with the accompanying drawings.

BRIEF DESCRPITION OF THE DRAWINGS

DESCRIPTION OF THE PREFERRED EMBODIMENTS

Figure 1:
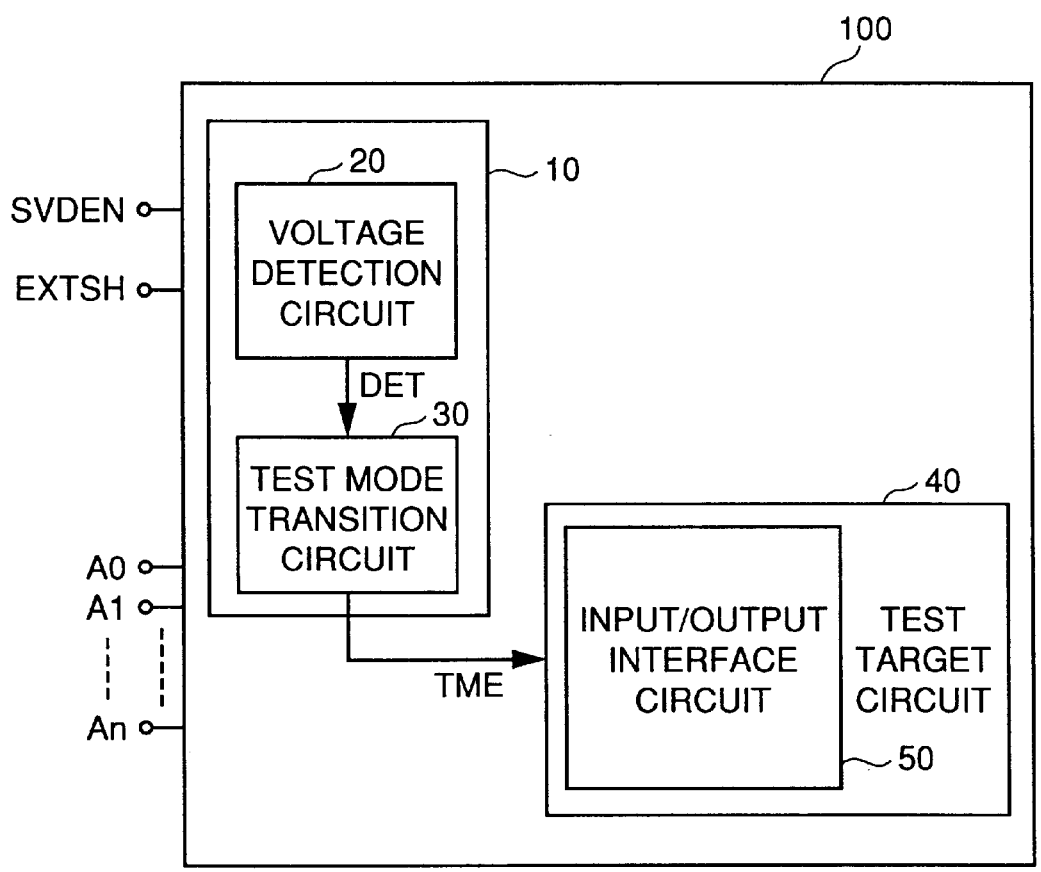
FIG. 1 is a schematic block diagram of a semiconductor memory device according to one embodiment of the present invention.

An embodiment of the present invention is hereinafter described in detail in conjunction with the drawings. It is noted that the same or corresponding components are denoted by the same reference character and description thereof is not repeated.

Referring to FIG. 1, a semiconductor memory device 100 according to the present invention includes a test circuit 10 and a test target circuit 40. Test circuit 10 includes a voltage detection circuit 20 and a test mode transition circuit 30. Test target circuit 40 includes an input/output interface circuit 50.

Voltage detection circuit 20 is activated by an activation signal SVDEN supplied from an input/output terminal. Voltage detection circuit 20 detects a test command signal EXTSH supplied from an input/output terminal to output a detection signal DET to test mode transition circuit 30. A method of detecting detection signal DET is explained later.

Test mode transition circuit 30 generates a test mode signal TME according to detection signal DET to output it to test target circuit 40. The test mode signal is provided to test target circuit 40 via input/output interface circuit 50 to cause transition of circuit 40 to a test mode. A specified bit pattern is provided via input/output interface circuit 50 which is supplied from input/output terminals for address signals A0–An in order to perform various tests.

Figure 2:
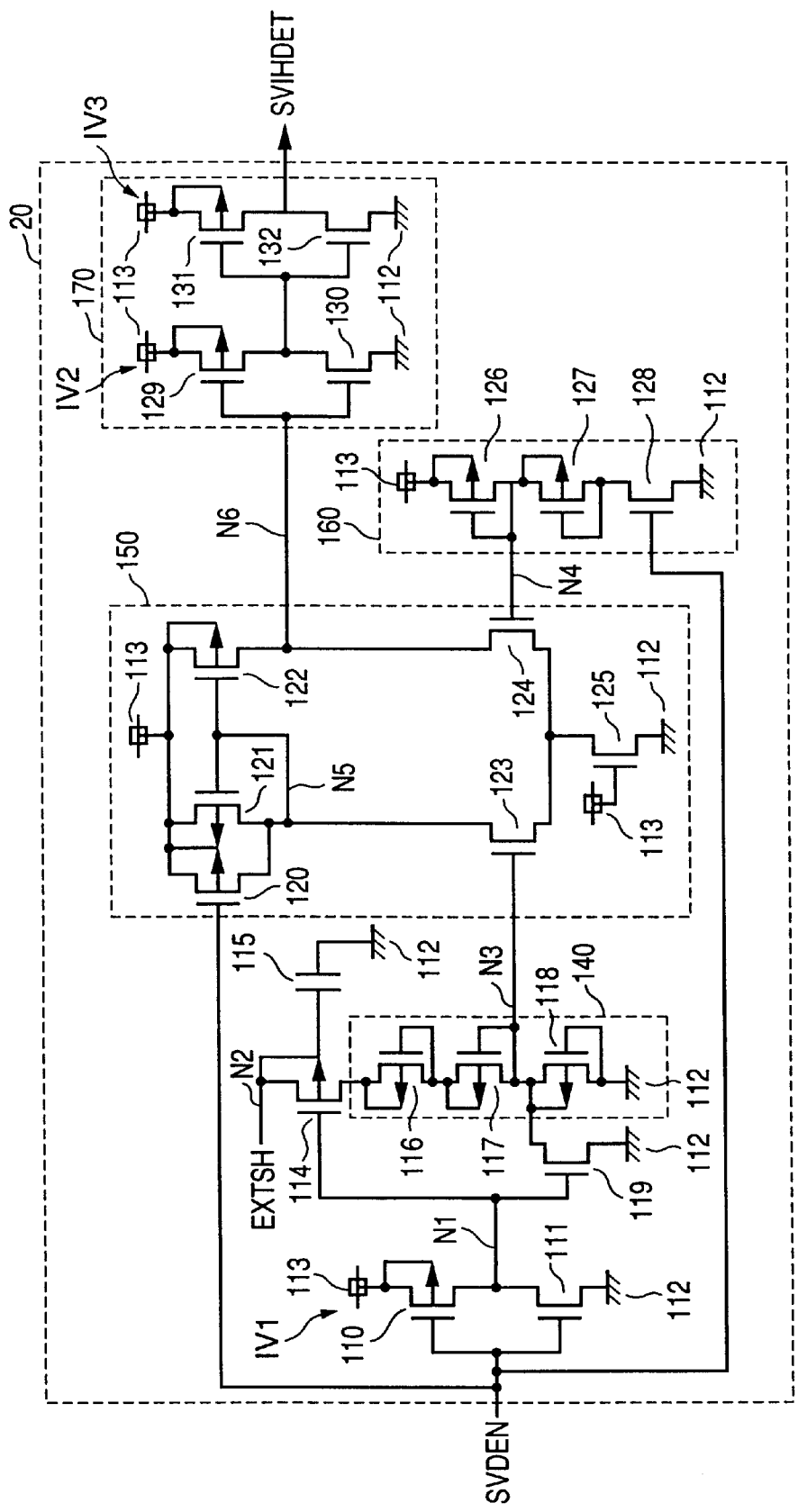
FIG. 2 is a circuit diagram of a voltage detection circuit shown in FIG. 1.

Referring to FIG. 2, voltage detection circuit 20 includes P channel MOS transistors 110, 114, 116–118, 120–122, 126, 127, 129 and 131, and N channel MOS transistors 111, 119, 123–125, 128, 130 and 132.

P channel MOS transistor 110 and N channel MOS transistor 111 are connected in series between a ground node 112 and a power supply node 113 to constitute an inverter IV1. Inverter IV1 receives activation signal SVDEN and supplies an inverted signal of activation signal SVDEN to a node N1.

P channel MOS transistors 116–118 are connected in series between ground node 112 and P channel MOS transistor 114 to constitute a voltage division circuit 140. P channel MOS transistor 114 is arranged between an input node N2 to which test command signal EXTSH is input and voltage division circuit 140. P channel MOS transistor 114 is turned on/off according to a signal on node N11 received at its gate telrinal. On the backside of the gate terminal of P channel MOS transistor 114, an N type well element 115 is provided between the gate terminal and ground node 112.

N channel MOS transistor 119 is connected in parallel with P channel MOS transistor 118 between a node N3 and ground node 112. N channel MOS transistor 119 is turned on/off according to a signal on node N11 received at its gate terminal.

P channel MOS transistors 121 and 122 and N channel MOS transistors 123–125 constitute a comparison circuit 150 of differential amplification type. Comparison circuit 150 is a so-called current mirror type differential amplifier circuit, that is operated by a ground voltage applied from ground node 112 and an external supply voltage applied from supply node 113. P channel MOS transistor 121 and N channel MOS transistor 123, and P channel MOS transistor 122 and N channel MOS transistor 124 are connected in parallel, both being connected between supply node 113 and the source terminal of N channel MOS transistor 125.

N channel MOS transistor 123 receives at its gate terminal a voltage on node N3, and N channel MOS transistor 124 receives at its gate terminal a voltage on a node N4.

N channel MOS transistor 125 has its drain terminal connected to ground node 112. N channel MOS transistor 125 is turned on by the external supply voltage applied to its gate terminal from supply node 113 such that the sum of the amount of current flowing from N channel MOS transistor 123 and the amount of current flowing from N channel MOS transistor 124 is kept constant.

From a node N6 connected between P channel MOS transistor 122 and N channel MOS transistor 124, a result of comparison by comparison circuit 150 is supplied.

A node N5 between P channel MOS transistor 121 and N channel MOS transistor 123 is connected to respective gate terminals of P channel MOS transistors 121 and 122.

Comparison circuit 150 outputs to node N6, when a voltage on node N3 is higher than a voltage on node N4, a voltage higher than a voltage on node N5. When the voltage on node N3 is lower than the voltage on node N4, comparison circuit 150 outputs to node N6 a voltage lower than the voltage on node N5. The voltage on node N3 is compared with the voltage on node N4 using the value of the voltage output to node N6.

P channel MOS transistor 120 is connected between supply node 113 and node N5 and is turned on/off by activation signal SVDEN supplied to its gate terminal. When P channel MOS transistor 120 receives activation signal SVDEN of L level at its gate terminal, it is turned on to inactivate comparison circuit 150. When P channel MOS transistor 120 receives activation signal SVDEN of H level at its gate terminal, it is turned off to activate comparison circuit 150.

P channel MOS transistors 126 and 127 and N channel MOS transistor 128 are connected in series between supply node 113 and ground node 112 to constitute a voltage division circuit 160 that is activated by N channel MOS transistor 128. N channel MOS transistor 128 is turned on/off by activation signal SVDEN supplied to its gate terminal.

P channel MOS transistor 129 and N channel MOS transistor 130, and P channel MOS transistor 131 and N channel MOS transistor 132, are connected between ground node 112 and supply node 113. P channel MOS transistor 129 and N channel MOS transistor 130 constitute an inverter IV2 while P channel MOS transistor 131 and N channel MOS transistor 132 constitute an inverter IV3. Inverters IV2 and IV3 constitute a logic circuit 170 that converts a voltage on node N6 into a logic signal and outputs the signal.

Test command signal EXTSH is formed of a test command voltage higher than the range of input voltage in a normal operation.

Voltage division circuit 140 derives from the test command voltage applied via P channel MOS transistor 114 a voltage which is one-third of the original voltage by P channel MOS transistors 116–118, and supplies the resultant voltage fraction to node N3.

Voltage division circuit 160 derives from the external supply voltage applied from supply node 113 a voltage which is a half of the original voltage by P channel MOS transistors 126 and 127 and outputs the resultant voltage fraction to node N4.

For example, if 3.8 V is supplied as a test command voltage, voltage division circuit 140 uses P channel MOS transistors 116–118 to derive a voltage fraction of 1.27 V from 3.8 V. If 2.5 V is supplied as an external supply voltage, voltage division circuit 160 uses P channel MOS transistors 126 and 127 to derive a voltage fraction of 1.25 V from 2.5 V.

P channel MOS transistors 116–118 constituting voltage division circuit 140 and P channel MOS transistors 126 and 127 constituting voltage division circuit 160 operate in the resistance mode. Accordingly, if P channel MOS transistors 116–118 operate in the same resistance mode and P channel MOS transistors 126 and 127 operate in the same resistance mode, voltage division circuit 140 derives from a test command voltage a voltage fraction which is one-third of the original voltage while voltage division circuit 160 derives from an external supply voltage a voltage fraction which is a half of the original voltage. Even if the resistance mode of P channel MOS transistors 116–118 differs from the resistance mode of P channel MOS transistors 126 and 127, one-third of a test command voltage is supplied to node N3 and a half of an external supply voltage is supplied to node N4.

Accordingly, the channel resistance of P channel MOS transistors 116–118 and the channel resistance of P channel MOS transistors 126 and 127 can merely be controlled to keep a stable level difference between the voltage fraction applied to node N3 and the voltage fraction applied to node N4.

According to the present invention, it is just required that P channel MOS transistors 116–118 operate in the same resistance mode and P channel MOS transistors 126 and 127 operate in the same resistance mode. Therefore, the resistance mode of P channel MOS transistors 116–118 and that of P channel MOS transistors 126 and 127 may be the same or different from each other.

Figure 3:
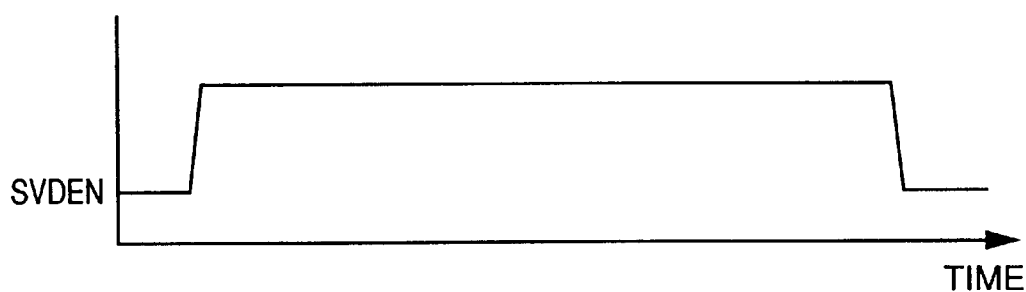
FIG. 3 is a timing chart of an activation signal for activating the voltage detection circuit shown in FIG. 2.

Voltage detection circuit 20 is activated by activation signal SVDEN shown in FIG. 3. When activation signal SVDEN has L level, inverter IV1 outputs a signal of H level to node N11. Then, P channel MOS transistor 114 is turned off and N channel MOS transistor 119 is turned on. P channel MOS transistor 120 is turned on and N channel MOS transistor 128 is turned off. Voltage division circuit 140 is inactivated with node N3 being kept at the ground potential and comparison circuit 150 and voltage division circuit 160 are also be inactivated.

When activation signal SVDEN has H level, inverter IV1 outputs a signal of L level to node N11. Then, P channel MOS transistor 114 is turned on and N channel MOS transistor 119 is turned off. P channel MOS transistor 120 is turned off and N channel MOS transistor 128 is turned on. Voltage division circuits 140 and 160 and comparison circuit 150 are activated. Voltage division circuit 140 derives from a test command voltage VTS supplied from P channel MOS transistor 114 a voltage fraction which is one-third of the original voltage and provides the voltage fraction VTS/3 to node N3. Voltage division circuit 160 derives from an external supply voltage VDD applied from supply node 113 a voltage fraction which is a half of the original voltage and provides the voltage fraction VDD/2 to node N4.

Comparison circuit 150 compares the voltage fraction VTS/3 on node N3 with the voltage fraction VDD/2 on node N4 and provides a result of the comparison to node N6. If test command voltage VTS is at least 3/2 times higher than external supply voltage VDD, the relation VTS/3≧VDD/2 is satisfied and thus the voltage fraction on node N3 is equal to or higher than the voltage fraction on node N4. Then, comparison circuit 150 outputs a voltage VH1 higher than a voltage on node N5 to node N6.

On the other hand, if test command voltage VTS is lower than the voltage which is 3/2 times as high as external supply voltage VDD, the relation VTS/3≦VDD/2 is satisfied and thus the voltage fraction on node N3 is lower than the voltage fraction on node N4. Then, comparison circuit 150 outputs a voltage VH2 lower than the voltage on node N5 to node N6.

A voltage VI causing switch between on and off of P channel MOS transistors 129 and 131 and N channel MOS transistors 130 and 132 can be set between voltages VH1 and VH2 supplied onto node N6 to enable logic circuit 170 to convert voltages VH1 and VH2 into logic signals respectively opposite to each other and output the resultant logic signals.

Specifically, when comparison circuit 150 supplies to node N6 voltage VH1 which is higher than voltage V1, inverter IV2 outputs a signal of L level while inverter IV3 outputs a signal of H level which is an inverted version of the L level signal. When comparison circuit 150 supplies to node N6 voltage VH2 which is lower than voltage V1, inverter IV2 outputs a signal of H level while inverter IV3 outputs a signal of L level which is an inverted version of the H level signal.

Accordingly, if voltage detection circuit 20 outputs signal SVIHDET of H level, it means that test command voltage VTS is detected. If voltage detection circuit 20 outputs signal SVIHDET of L level, it means that test command voltage VTS is not detected. Here, the signal SVIHDET of H level is referred to as a detection signal of test command signal EXTSH.

When activation signal SVDEN has L level, inverter IV1 supplies an H level signal to the gate terminal of N channel MOS transistor 119 to turn on N channel MOS transistor 119 and keep node N3 at the ground potential. When activation signal has H level, inverter IV1 supplies an L level signal to the gate terminal of N channel MOS transistor 119 to turn off N channel MOS transistor 119 and free node N3 from the ground potential. In this way, inverter IV1 and N channel MOS transistor 119 constitute a ground potential holding circuit or potential switching circuit.

When activation signal SVDEN has L level, inverter IV1 provides an H level signal to the gate terminal of P channel MOS transistor 114 to turn off P channel MOS transistor 114 and separate voltage division circuit 140 from input node N2. When activation signal SVDEN has H level, inverter IV1 provides an L level signal to the gate terminal of P channel MOS transistor 114 to turn on P channel MOS transistor 114 and supply the test command voltage applied to input node N2 to voltage division circuit 140. Accordingly, inverter IV1 and P channel MOS transistor 114 constitute a switching circuit.

Referring again to FIG. 1, when voltage detection circuit 20 is activated by activation signal SVDEN supplied from the input/output terminal, voltage detection circuit 20 then detects test command voltage VTS forming test command signal EXTSH provided from the input/output terminal in the manner explained above, and outputs detection signal DET formed of signal SVIHDET of H level to test mode transition circuit 30.

Receiving detection signal DET, test mode transition circuit 30 outputs test mode transition signal TME to test target circuit 40. Test mode transition signal TNE is provided via input/output interface circuit 50 to test target circuit 40 to cause transition thereof to a test mode. A specified bit pattern is supplied fiom input/output terminals for address signals A0, A1, . . . , An to test target circuit 40 via input/output interface circuit 50 to perform a test for test target circuit 40.

Test circuit 10 can thus detect the test command signal in a stable manner by voltage detection circuit 20 and accordingly ensure transition of test target circuit 40 to a test mode.

Figure 4:
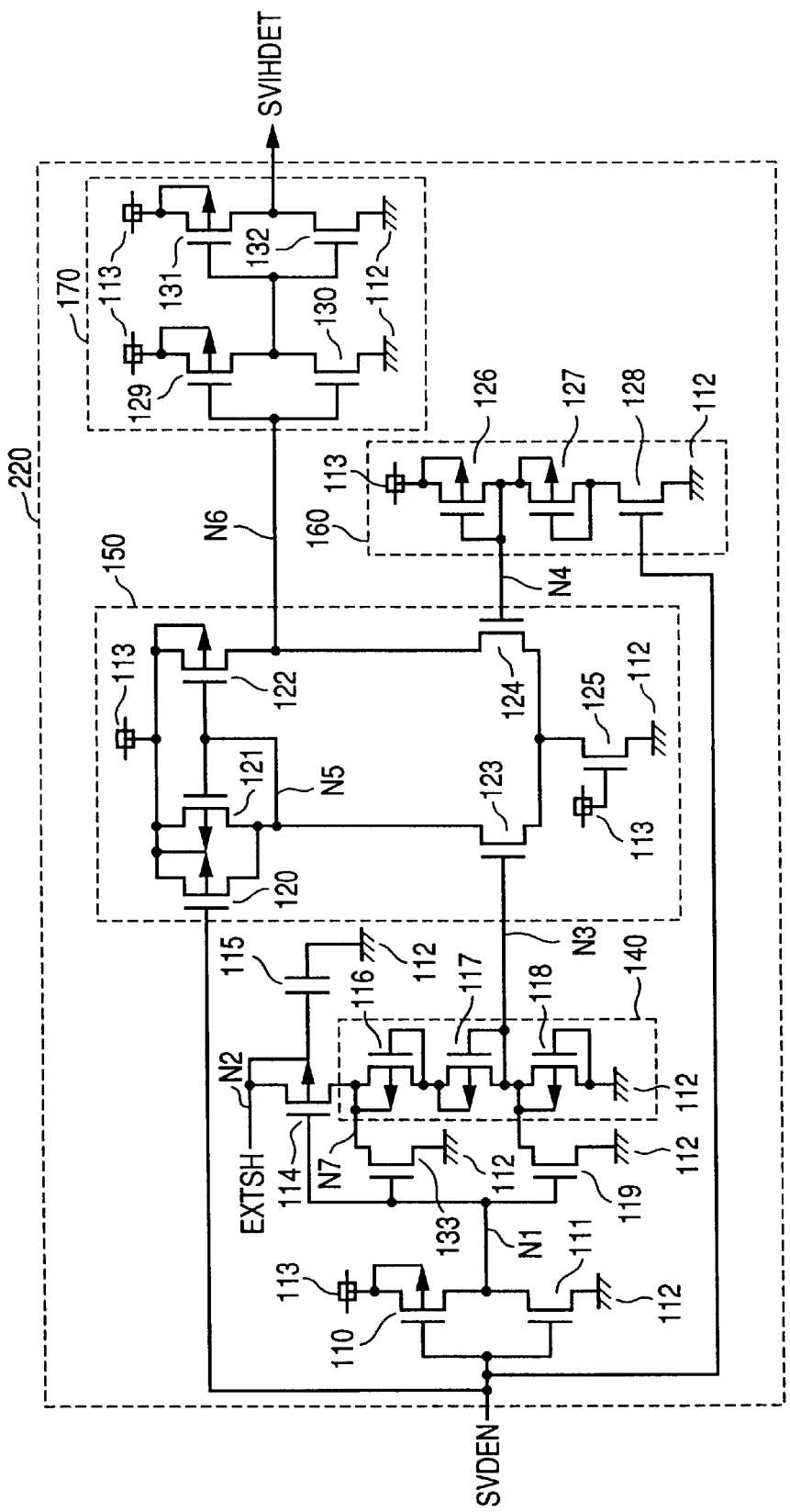
FIG. 4 is another circuit diagram of the voltage detection circuit shown in FIG. 1.
Figure 5:
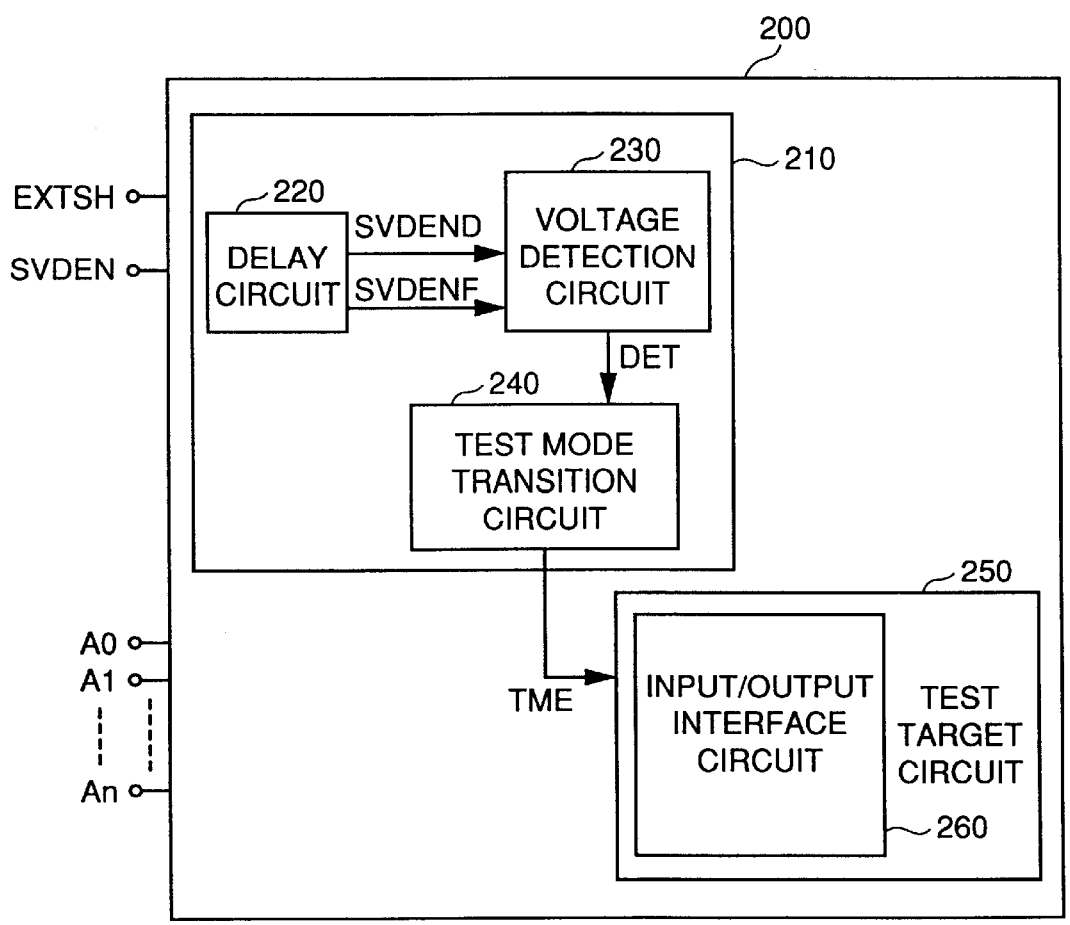
FIG. 5 is a schematic block diagram of a conventional semiconductor memory device.
Figure 6:
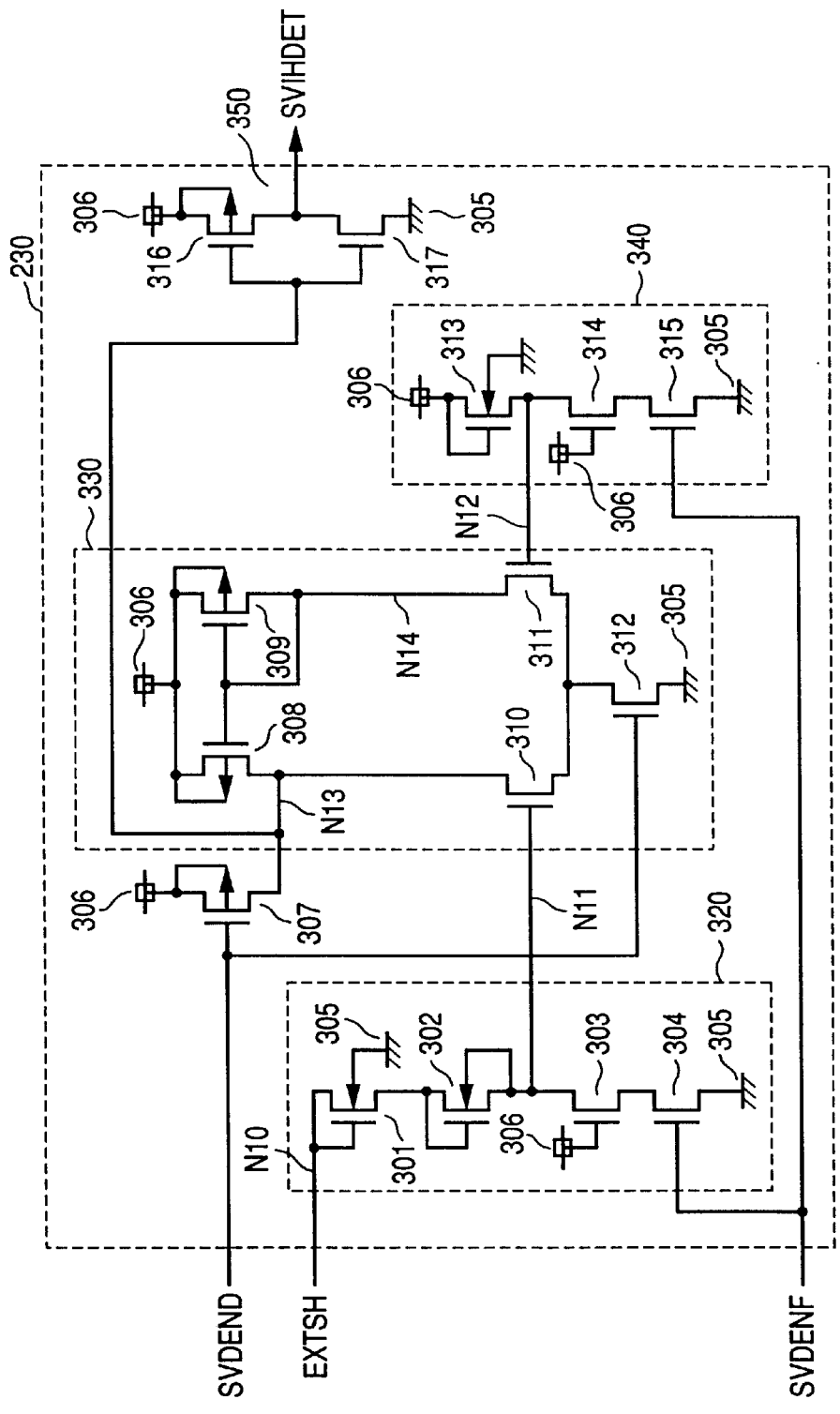
FIG. 6 is a circuit diagram of a voltage detection circuit shown in FIG. 5.
Figure 7:
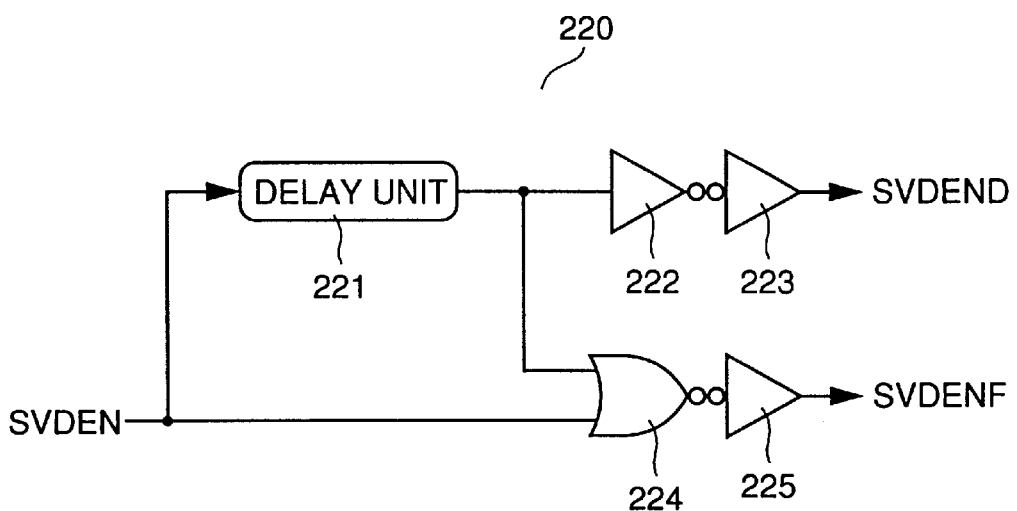
FIG. 7 is a circuit diagram of a delay circuit shown in FIG. 5.
Figure 8:
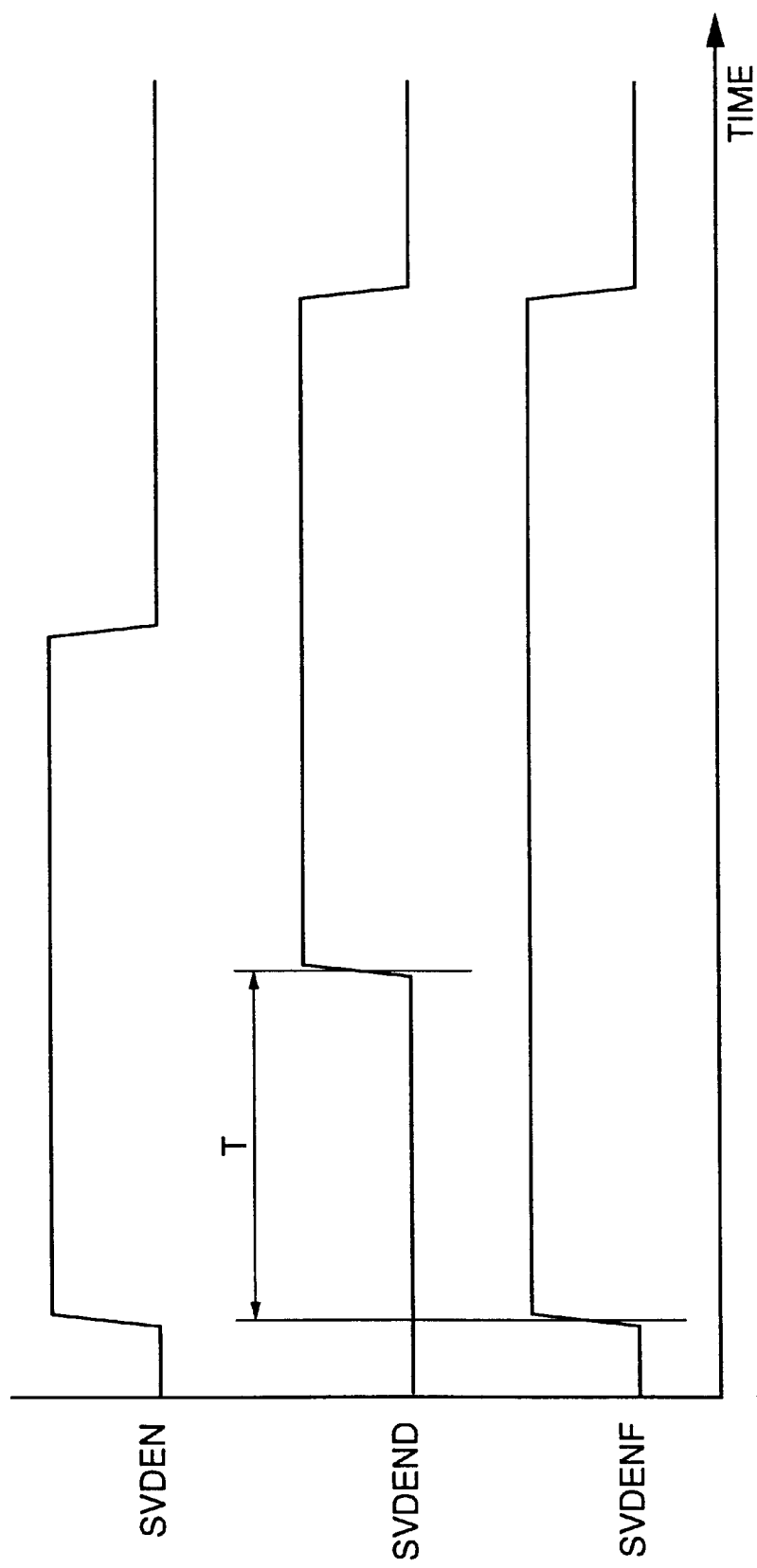
FIG. 8 is a timing chart of a signal in the voltage detection circuit shown in FIG. 6.

A voltage detection circuit employed in semiconductor memory device 100 is not limited to voltage detection circuit 20 shown in FIG. 2 and a voltage detection circuit 220 shown in FIG. 4 may be employed alternatively.

Voltage detection circuit 220 is constructed by adding an N channel MOS transistor 133 to voltage detection circuit 20, and other components are identical to those in detection circuit 20. N channel MOS transistor 133 has its source terminal connected to a node N7 between a P channel MOS transistor 114 and a voltage division circuit 140, its drain terminal connected to a ground node 112, and its gate terminal receiving an output signal of an inverter IV1.

When the output signal of inverter IV1 has H level, N channel MOS transistor 133 is turned on and node N7 is maintained at a ground potential. When the output signal of inverter IV1 has L level, N channel MOS transistor 133 is turned off and node N7 is freed from the ground potential. In other words, N channel MOS transistor 133 is turned off when voltage division circuit 140 is activated and turned on when voltage division circuit 140 is inactivated.

After voltage detection circuit 220 is activated to detect test command voltage VTS by the method discussed above and accordingly a certain test is conducted for test target circuit 40, voltage detection circuit 220 is inactivated to turn on N channel MOS transistor 133 and keep node N7 at the ground potential. Then, when voltage detection circuit 220 is activated again to turn off N channel MOS transistor 133, another test is conducted for test target circuit 40. After the another test is completed, N channel MOS transistor is turned on again to keep node N7 at the ground potential. In this way, N channel MOS transistor 133 is kept turned on during the inactive state of voltage detection circuit 220 and node N7 is maintained at the ground potential. After several types of tests are conducted for test target circuit 40, voltage detection circuit 220 is still inactivated temporarily between one test and a following test to keep node N7 at the ground potential. Charges accumulated between P channel MOS transistor 114 and voltage division circuit 140 in execution of a test can thus be discharged to ground node 112. Even after several types of tests are carried out, test command voltage VTS for each test can be detected under the same condition. Test command voltage VTS can thus be detected in a stable manner.

Inverter IV1 and N channel MOS transistor 133 constitute a potential switching circuit.

In the description above regarding voltage detection circuits 20 and 220, the number of P channel MOS transistors constituting voltage division circuit 140 and that constituting voltage division circuit 160 are three and two respectively. However, the present invention is not restricted to this. Generally, the number of P channel MOS transistors constituting voltage division circuit 140 may be n (n is a natural number of at least three), and the number of P channel MOS transistors constituting voltage division circuit 160 may be m (m is a natural number smaller than n).

In this case, voltage division circuit 140 derives from test command voltage VTS a voltage fraction equal to one-nth of the original voltage and voltage division circuit 160 derives from external supply voltage VDD a voltage fraction equal to one-mth of the original voltage. Therefore, if test command voltage VTS equal to or higher than a voltage which is n/m times as high as external supply voltage VDD is supplied from node N2, voltage division circuit 140 provides to node N3 a voltage fraction equal to or higher than VTS/n=((n/m)×VDD)/n=VDD/m and voltage division circuit 160 provides to node N4 a voltage fraction of VDD/m. Those two voltage fractions are compared by the method explained above. Test command signal EXTSH is detected if voltage fraction VTS/n is equal to or higher than voltage fraction VDD/m.

Accordingly, test command signal EXTSH can be detected in a stable manner by supplying to node N2 as a test command voltage VTS a voltage of at least n/m times as high as the external supply voltage.

Voltage detection circuits 20 and 220 are described above as those being constituted of P channel MOS transistors. However, voltage detection circuits 20 and 220 may be constructed of N channel MOS transistors.

According to the embodiment of the invention, the semiconductor memory device detects a test command voltage by comparing a voltage fraction which is one-nth of the test command voltage forming the test command signal with a voltage fraction which is one-mth of an external supply voltage. For this reason, even if a circuit for deriving a fraction of the test command voltage and a circuit for deriving a fraction of the external supply voltage have electrical characteristics different from each other, the relation between the two fraction voltages can be preserved. Consequently, the test command voltage can be detected in a stable manner.

Further, according to the embodiment of the invention, the node from which a voltage fraction of the test command voltage is output is held at the ground potential when the voltage division circuit is inactivated. No malfunction occurs accordingly in the transition of the voltage division circuit from an inactive state to an active state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an input/output terminal for inputting a test command voltage forming a test command signal;
    a test target circuit; and
    a test circuit generating from said test command voltage a first voltage fraction by n diode-connected MOS transistors (n is a natural number of at least three) connected in series, said first voltage fraction being one-nth as high as said test command voltage, and generating from an external power supply voltage a second voltage fraction by m diode-connected MOS transistors (m is a natural number smaller than n) connected in series, said second voltage fraction being one-mth as high as said external power supply voltage, to cause transition of said test target circuit to a test mode when said first voltage fraction is at least said second voltage fraction.

2. The semiconductor memory device according to claim 1, wherein said test circuit includes:

a voltage detection circuit generating said first and second voltage fractions and outputting a first logic signal indicating detection of said test command voltage according to said first voltage fraction being at least said second voltage fraction and a second logic signal indicating detection of said test command voltage according to said first voltage fraction being lower than said second voltage fraction; and a test mode transition circuit causing transition of said test target circuit to the test mode according to said first logic signal.

3. The semiconductor memory device according to claim 2, wherein said voltage detection circuit includes:

a first voltage division circuit formed of said n MOS transistors to output said first voltage fraction to a first node;

a second voltage division circuit formed of said m MOS transistors to output said second voltage fraction to a second node;

a comparison circuit comparing said first voltage fraction with said second voltage fraction and differentially amplifying a result of the comparison to output the amplified result; and a logic circuit outputting said first logic signal when the output of said comparison circuit deviates to one side from a predetermined reference value and outputting said second logic signal when said output deviates to the other side from the predetermined reference value.

4. The semiconductor memory device according to claim 3, wherein said voltage detection circuit further includes a ground potential holding circuit connected between a ground node and said first node to hold said first node at a ground potential when said first voltage division circuit is inactive.

5. The semiconductor memory device according to claim 3, wherein said voltage detection circuit further includes:

a switching circuit connected between said first voltage division circuit and an input node supplied with said test command voltage to separate said first voltage division circuit from said input node in response to a third logic signal and supply said test command voltage to said first voltage division circuit in response to a fourth logic signal; and a first potential switching circuit connected between a ground node and said first node to free said first node from a ground potential in response to said third logic signal and hold said first node at the ground potential in response to said fourth logic signal.

6. The semiconductor memory device according to claim 5, wherein said voltage detection circuit further includes a second potential switching circuit connected between said ground node and a third node for connecting said switching circuit with said first voltage division circuit to free said third node from the ground potential in response to said third logic signal and hold said third node at the ground potential in response to said fourth logic signal.

* * * * *